United States Patent [19]
Harari

[11] Patent Number: 6,016,752
[45] Date of Patent: Jan. 25, 2000

[54] PRINT IMAGE POSITIONING

[75] Inventor: Shahar Harari, Tel Aviv, Israel

[73] Assignee: Scitex Corporation Ltd., Herzlia, Israel

[21] Appl. No.: 09/013,028

[22] Filed: Jan. 26, 1998

[30] Foreign Application Priority Data

Feb. 3, 1997 [IL] Israel .......................................... 120138

[51] Int. Cl.[7] .................................................... H04N 1/08
[52] U.S. Cl. .................. 101/486; 101/401.1; 101/415.1; 101/DIG. 36; 347/262; 358/492
[58] Field of Search ................. 101/141, 415.1, 101/467, 485, 486, DIG. 36, 401.1; 346/134, 138; 347/234, 262, 264; 358/297–299, 489–492

[56] References Cited

U.S. PATENT DOCUMENTS

| | | | |
|---|---|---|---|
| 4,745,487 | 5/1988 | Nishikawa | 358/289 |
| 4,833,985 | 5/1989 | Kojima et al. | 101/DIG. 36 |
| 4,897,737 | 1/1990 | Shalev | 358/489 |
| 5,370,051 | 12/1994 | Schild et al. | 101/DIG. 36 |
| 5,497,703 | 3/1996 | Becker | 101/DIG. 36 |
| 5,634,406 | 6/1997 | Lindner et al. | 101/DIG. 36 |
| 5,663,802 | 9/1997 | Beckett et al. | 358/299 |
| 5,668,588 | 9/1997 | Morizumi et al. | 347/242 |

*Primary Examiner*—Stephen R. Funk
*Attorney, Agent, or Firm*—Mark M. Friedman

[57] ABSTRACT

A method for recording a rectangular image along helical tracks on a plate, while the plate is mounted on a cylindrical surface in an imagesetter, so that an edge of the image, corresponding to a reference edge of the plate, essentially parallels the reference edge. The method includes punching one or more notches across the reference edge of the plate, providing two stop pins, fixedly attached to the cylindrical surface, and positioning the plate on the cylindrical surface so that one of the stop pins engages one of the notches.

8 Claims, 4 Drawing Sheets

PRINT IMAGE POSITIONING

FIELD AND BACKGROUND OF THE INVENTION

The present invention relates to a drum imagesetter and, more particularly, to a method for recording an image on a plate at the proper orientation.

A generally known type of imagesetter for recording a digital image onto a film or a printing plate is the so-called external drum imagesetter. Here, the film or the plate (both to be hereunder referred to as "plate") is attached to the cylindrical surface of the drum, then the drum rotates at a high speed, while one or more beams of light are modulated imagewise and focused onto the surface of the plate. According to one prevalent mode of operation, the assembly that projects the light beams onto the plate is made to move slowly and continuously parallel to the drum's axis. As a result, the focused light spot of each beam traces a helical path around the drum's surface. If the plate is mounted so that one of its edges is parallel to the drum's axis, the recorded trace of each beam is therefore inclined at some angle α from a direction normal to the edge, as shown in FIG. 1.

This inclination of the traced lines across the plate causes a corresponding distortion of the recorded image, namely a shear—or skew distortion. The effect is particularly strong, and thus objectionable, when the number of beams is relatively large, because then the pitch, which is the distance between consecutive traces of any one beam, and thus—the distance traveled by the beam axially during one drum rotation, is relatively large. The pitch is equal to the nominal distance between adjacent lines, multiplied by the number of beams.

It is noted that in common practice, the nominal distance between adjacent recorded lines (which is the inverse of the so-called resolution of the recording) may vary from one job to another. Consequently also the pitch of the helical trace varies and, accordingly, the angle α varies.

One known method, generally known in the art, to eliminate the resultant image distortion is to introduce a delay of the beam modulation signal, that regularly decreases by a slight amount from one rotation to the next. The effect of this varying delay is to cause the edge of the traced image, formed from the beginnings of all recorded lines, to be inclined at some angle β to the aforementioned edge of the plate, as shown in FIG. 2. By choosing the proper magnitude of decrement of the delay, the inclination angle β of the image edge can be made to be equal to the inclination angle α of the traced lines. The image is then formed on a truly rectilinear grid and thus is free from shear distortion.

A remaining problem is that the resultant image is rotated by an angle α with respect to the edge of the plate. Since, during printing, the plate is usually mounted on the print cylinder with its leading edge perpendicular to the paper's edge, the printed image likewise appears rotated by α with respect to the paper's edge—which, in most cases, is objectionable.

One solution to this problem is to mount the plate on the cylinder rotated by an angle -α with respect to its normal orientation, thus bringing the image back to be square with the paper. Such a solution would conceivably entail a specially adapted plate registration system for thus mounting the plate or modification of existing registration systems. This, however, may be difficult in practice—for the following reasons:

(a) A suitable mechanism would be complicated, since the value of α may be variable.

(b) Installing or modifying a registration system in all affected presses may be expensive.

(c) The orientation of the registration mechanism will have to be adjusted between different plates—e.g. for different values of α or for normally exposed (non-rotated image) plates which is time consuming and is prone to errors.

There may also be objection to this solution on the grounds that (d) on some presses, a skewed plate may not be desirable.

It is noted that plate registration systems on most presses usually employ a pin registration method. According to this method, a printing plate has a number of holes punched along its leading edge and the printing cylinder has corresponding pins rigidly attached thereto. When the plate is mounted on the cylinder, the pins engage the punched holes and thus the plate is positively oriented with respect to the cylinder.

Another solution to the problem is to mount the plate on the exposure drum of the imagesetter rotated by an angle α with respect to its normal orientation. The image will then be recorded at the correct orientation with respect to a reference edge (usually—the leading edge) of the plate. The main difficulty of such a solution is with mounting the plate at exactly the correct angle. Generally, plates are positioned on the drum, using registration pins attached thereto and engaging corresponding holes on the plate (which holes are subsequently used for registration in the press, as explained hereabove), or having the leading edge of the plate butt against a guide bar, or a set of pins, attached to the drum. Such positioning methods do not easily allow orienting the plate, during exposure, at the desired angle α—particularly if a is variable, as it often is. On the other hand, manually positioning the plate on the drum at the desired orientation may be a tedious and lengthy task, which is, moreover, prone to errors, and is therefore impractical.

There is thus a widely recognized need for, and it would be highly advantageous to have, a practical system for recording on a plate, in an external-drum imagesetter, a rectilinearly formed image so that, when printed, it will be squarely oriented with respect to the edge of the paper.

SUMMARY OF THE INVENTION

The present invention successfully addresses the shortcomings of the presently known configurations by providing a practical system for recording on a plate, in an external-drum imagesetter, a rectilinearly formed image so that, when printed, it will be squarely oriented with respect to the edge of the paper.

The present invention discloses a novel method for positioning the plate on the drum of the imagesetter, rotated by the same angle by which the recorded image is rotated, so that the edges of the image end up parallel to the edges of the plate. The present invention also teaches how to, alternatively, rectify a rotated image so that, upon printing, its edges will be parallel to the paper edges, by punching commensurately rotated registration holes in the plate.

More specifically, one major configuration of the method of the present invention, provides for accurately positioning a plate on the drum, rotated by the same angle α by which the image is rotated during recording. The configuration has two alternative ways of registering the plate on the drum in the proper orientation: One way is punching a notch across a reference edge of the plate, of the proper depth and providing two fixed stop- or registration pins on the drum; one of the pins engages the notch and the other stops the edge at another point, thus causing it to be inclined by α with respect to a horizontal line. A variation of this first way is punching a pair of registration holes on a line inclined by α from the edge of the plate and engaging them to the pins on the drum. The other way to realize this configuration is to make the position of one of the pins on the drum adjustable, in a circumferential direction; the (intact) edge of the plate is then made to contact the pins and thus assume a non-horizontal orientation. A variation of this second way is to have a normally-oriented set of registration holes punched in the plate and engaging them to the pins on the drum.

Another major configuration leaves the image rotated by α with respect to the plate, but provides for conveniently positioning the plate on a print cylinder of the press (or on the surface of a contact copier) rotated by −α, so that the image prints squarely with the edges of the medium.

According to a first configuration of the present invention there is provided a method for recording a rectangular image along helical tracks on a plate, while the plate is mounted on a cylindrical surface in an imagesetter, so that an edge of the image, corresponding to a reference edge of the plate, essentially parallels the reference edge, the method comprising the steps of (a) punching at least one notch across the reference edge of the plate,
(b) providing two stop pins, fixedly attached to the cylindrical surface, and
(c) positioning the plate on the cylindrical surface so that one of the stop pins engages the notch.

According to further features in preferred embodiments of this configuration, the depth of the notch is adjustable.

According to an alternative embodiment of this configuration, the method comprises the steps of (a) punching at least two holes in the plate, each of the holes being symmetrically shaped, so that a line joining the centers of the holes is generally not parallel to the reference edge of the plate,
(b) providing two registration pins, fixedly attached to the cylindrical surface, and
(c) positioning the plate on the cylindrical surface so that the registration pins engage corresponding ones of the holes.

According to an alternative configuration of the present invention, there is provided a method for recording a rectangular image along helical tracks on a plate, while the plate is mounted on a cylindrical surface in an imagesetter, so that an edge of the image, corresponding to a reference edge of the plate, essentially parallels the reference edge, the method comprising the steps of (a) providing two curved surfaces, protruding normally from the cylindrical surface, such that essentially no line tangent to both of the curved surfaces is parallel to the geometric axis of the cylindrical surface, and
(b) positioning the plate on the cylindrical surface so that the reference edge of the plate touches both of the curved surfaces, each at a respective contact point.

According to further features in the described preferred embodiments, one of the curved surfaces is configured so that the position of its respective contact point with respect to the cylindrical surface, along a generally circumferential direction, is adjustable and configured either as a pin movable along a circumferential track, or as a rotatable cam.

According to an alternative embodiment of this configuration, the plate having registration holes and the method comprises the steps of (a) providing two registration pins, protruding from the cylindrical surface and matching the registration holes, such that a line joining the centers of their bases is generally not parallel to the geometric axis of the cylindrical surface, and (b) positioning the plate on the cylindrical surface so that the pins engage the holes.

According to yet another configuration of the present invention, there is provided a method for recording a rectangular image along helical tracks on a plate, mounted on a cylindrical surface in an imagesetter, whereby an edge of the image corresponding to a reference edge of the plate forms an essentially non-zero angle α with the reference edge, and for correcting the printing orientation of the recorded image, the plate being initially without print registration holes, the method comprising the steps of (a) punching a set of print registration holes in the plate, the centers of the holes being joined by a straight line and the line being rotated an angle α from its normal orientation with respect to the reference edge of the plate, and
(b) providing means for aligning the reference edge of the plate with a line on the cylindrical surface that is essentially parallel to the geometric axis of the cylindrical surface.

DESCRIPTION OF THE PREFERRED EMBODIMENTS

The present invention is of a method and apparatus for recording an undistorted image on a late in an external-drum imagesetter, properly oriented with respect to the plate or, eventually, with respect to the printed paper.

Specifically, the present invention can be used to mount the plate on the drum of a multi-beam imagesetter so that a rotated rectilinear image will be recorded thereon at a correct square orientation with respect to its reference edge or, alternatively—to punch registration holes in the plate so that the image will be printed at a correct square orientation with respect to the paper.

The method and apparatus according to the present invention may be better understood with reference to the drawings and the accompanying description.

Figure 1:
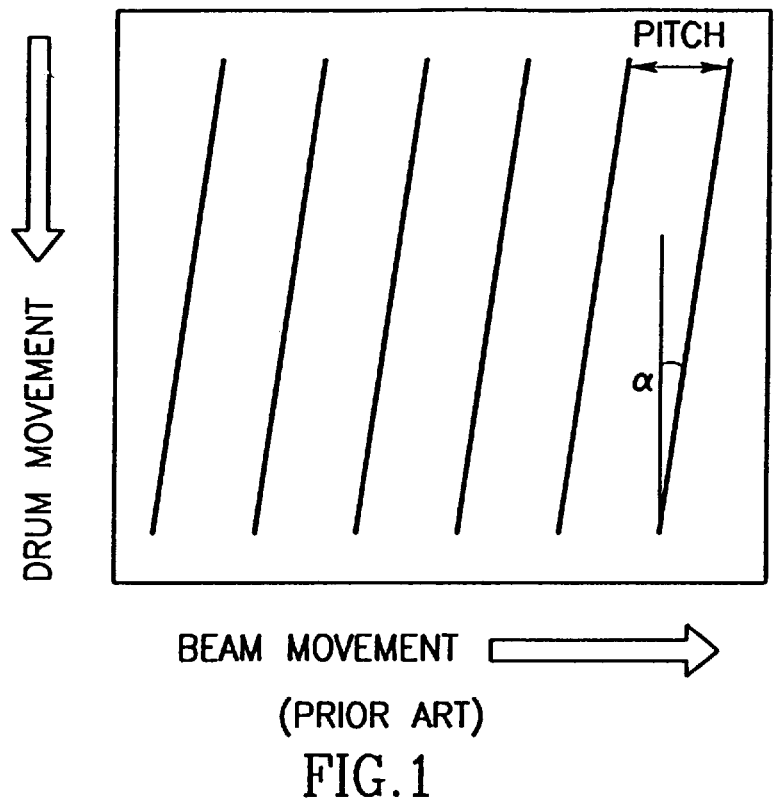
FIG. 1 schematically illustrates the recording path of a light beam on a plate in a typical imagesetter according to prior art.
Figure 2:
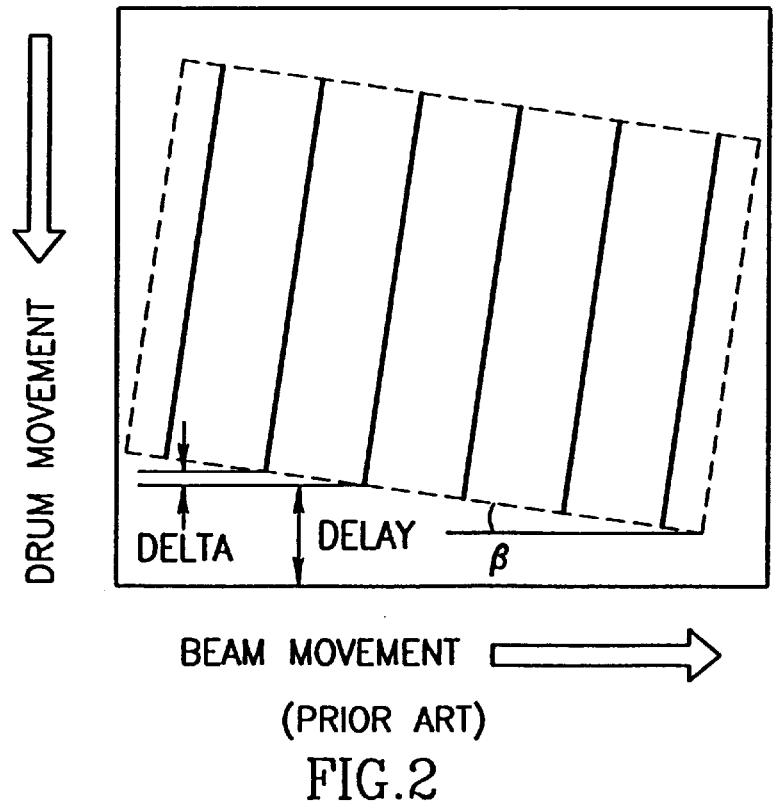
FIG. 2 schematically illustrates a corrected recording path in the imagesetter of FIG. 1 according to prior art.
Figure 3:
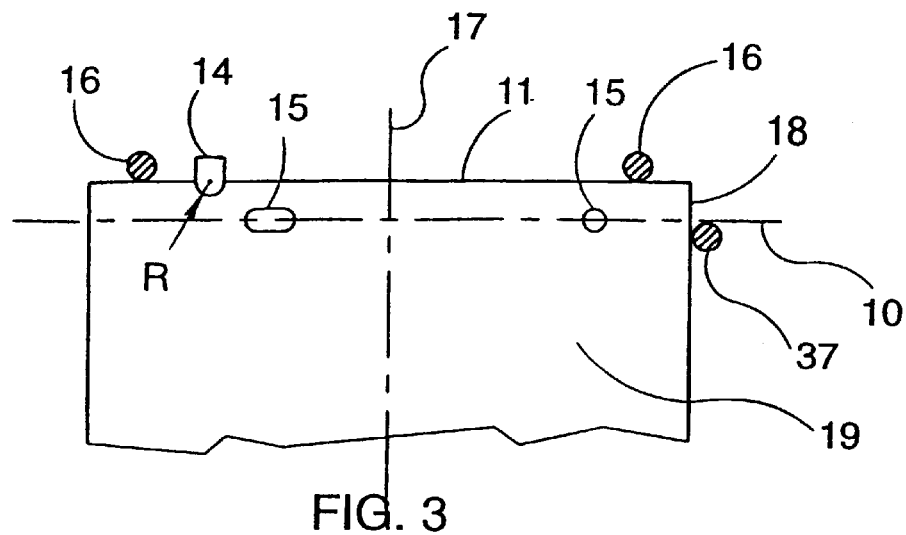
FIG. 3 schematically illustrates a punch configuration according to a first embodiment of the present invention.

Referring now to the drawings, FIG. 3 schematically shows the top portion of a typical printing plate 19, including its top edge 11. FIG. 3 also illustrates one aspect of a first configuration of the present invention, as follows: Plate 19 is laid flat on the mount of a punch (not shown), with its top edge 11 flush against a pair of upright pins 16 that are fixedly attached to the mount. The extremities of the cylindrical surface of pins 16 thus define a reference line for the plate's top edge. It is appreciated that other configurations for thus forming a mechanical reference line, such as a straight bar or other forms of protrusions, are known and applicable. Plate 19 is usually also placed so that it is laterally centered with respect to a centerline 17.

The punch is equipped with two sets of dies. A first set of dies is shaped and positioned so as to punch print registration holes 15, similarly to a conventional punch; the centers of holes 15 lie on a line 10 that is generally near and parallel to top edge 11. It is noted that there are, in practice, various configurations of print registration holes 15, some with more than two holes; in the present example, a particular two-holes configuration is shown, but it should be understood that the present invention is applicable to any configuration. The second set consists preferably of one die 14, shaped to punch a notch with an arcuate end of radius R, as illustrated. Die 14 is positioned above the reference line formed by pins 16 (i.e. above the top edge of the plate to be punched) laterally a certain distance from the centerline 17. In the orthogonal dimension, the position of die 14 is adjustable so that it can cut a notch of variable depth into the top edge 11 of the plate.

Figure 4:
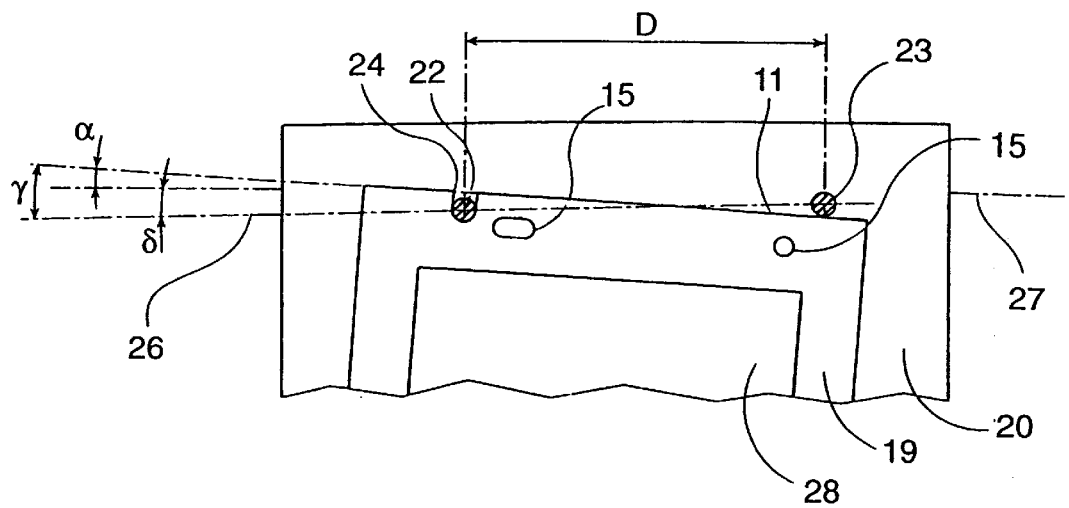
FIG. 4 schematically illustrates positioning a plate on the drum of an imagesetter according to the first embodiment of the present invention.

We now refer to FIG. 4, which schematically shows a projected view of the surface 20 of the drum of an imagesetter (not shown), modified according to the present invention. Attached to surface 20 is a pair of protruding pins 22 and 23, a distance D apart, whose centers are on a line 26, which forms some small angle 6 with a line parallel to the drum's axis 27. Distance D is preferably different from the distance between any of the print registration holes in any configuration, such as holes 15. The diameter of pin 22 is such that it exactly fits into the notch punched by die 14, the diameters of both pins being preferably equal.

Also shown in FIG. 4 is a plate 19, similar to that shown in FIG. 3, having punched print registration holes 15 and a punched notch 24, mounted on the surface 20 of the drum. Plate 19 is positioned so that pin 22 is inside notch 24, flush against its (rounded) end, and top edge 11 is flush against pin 23. It is a primary feature of the first configuration of the present invention that the plate is positioned with respect to fixed pins on the drum in a manner such as described hereabove and not by engaging two print registration holes, such as holes 15. It is noted that when plate 19 is thus positioned, its top edge 11 generally forms a non-zero angle $\gamma$ with respect to line 26. The value of angle $\gamma$ (in radians) is very nearly equal to the ratio of the depth of notch 24 to D. The position of die 14 with respect to the edge line in the punch of FIG. 3, which determines the depth of notch 24, may thus be marked in terms of the resultant angle $\gamma$. Since, as will be shown, the angle $\gamma$ is preferably made to have a constant difference $\delta$ from the angle $\alpha$ of image rotation (as explained in the background section), which, in turn, is a function of plotting resolution, the position of die 14 may also be marked in terms of plotting resolutions. It is appreciated that in the case that only a single value of the angle $\alpha$ is ever expected (e.g. when a single plotting resolution is employed), the position of die 14 need not be variable, but rather may be fixed—to effect a notch of a proper fixed depth.

Figure 3A:
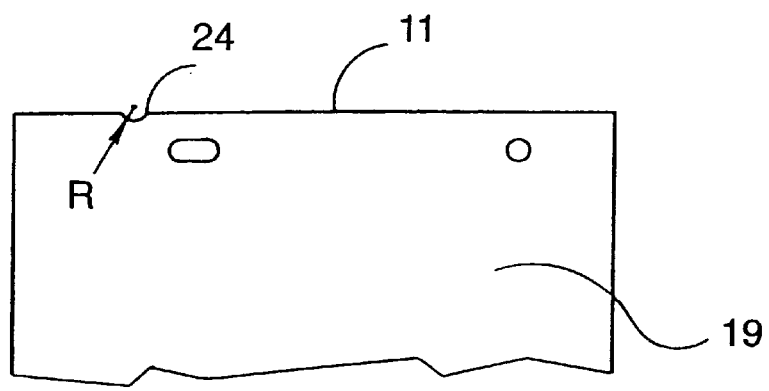
FIGS. 3A and 3B depict two configurations of a plate punched by the punch of FIG. 3.
Figure 3B:
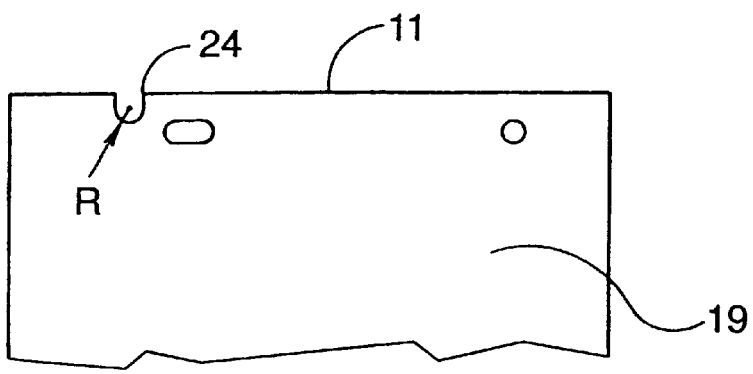

The method of the present invention in the first configuration is carried out as follows: The intended plotting resolution is determined and, possibly, the resulting angle $\alpha$ of image rotation is calculated (or read from a table). A plate 19, to be imaged, is placed on the mount of the punch, its upper edge 11 pushed against pins 16 and side edge 18 pushed against pin 37. The position of die 14 is set so that the depth of notch 24 will be such as to result in a skew angle $\gamma$, equal to $\alpha+\delta$. The punch is then operated to effect the notch 24 and the print registration holes 15. The shape of the resultant upper portion of the plate is shown in FIGS. 3A and 3B. FIG. 3A illustrates the case that the angle $\gamma$ is small and therefore the notch is shallow, while in the case of FIG. 3B the angle $\gamma$ is relatively large and therefore the notch is deep; in both cases the end of the notch is circular, with a radius R. The value of $\delta$ is conveniently chosen so that the depth of notch 24 required to obtain the appropriate value of $\gamma$, spans some practical range; while theoretically it could also be zero, too small a value for $\delta$ may, in practical cases, result in a notch that is too shallow to be easily engaged by pin 22.

Subsequently, plate 19 is placed on the surface 20 of the imagesetter drum so that notch 24 is engaged by pin 22 at maximum depth and so that top edge 11 is pushed against pin 23. At such a position, plate 19 is made to fully adhere to the surface of the drum, in the usual manner, and imaging operation commences. The resultant imaged area (marked as 28 in FIG. 4) will generally form a rectangle, whose top edge is essentially parallel with plate edge 11 (both forming an angle $\alpha$ with respect to a line parallel to the drum's axis). It is noted that the cooperation of notch 24 and pin 22 serves to register the plate in proper position, while the additional cooperation of pin 23 and top edge 11 serves to determine the plate's proper orientation.

For printing, plate 19 is mounted on the printing cylinder (not shown), with print registration holes 15 engaged by the standard pins on the cylinder, in the usual manner.

Figure 6:
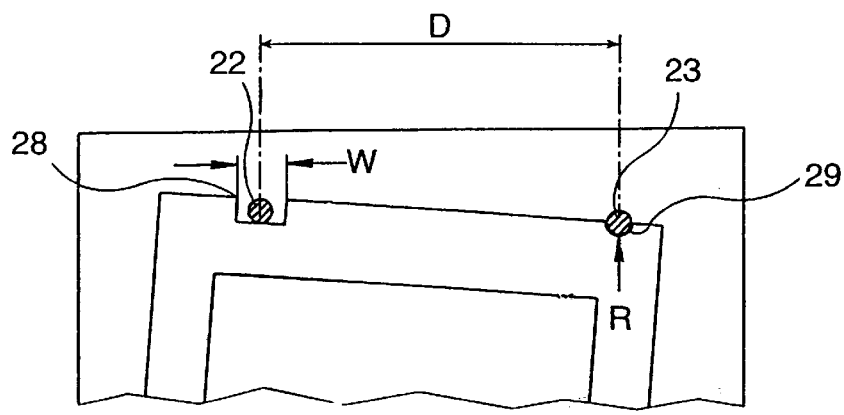
FIG. 6 schematically illustrates positioning a plate on the drum of an imagesetter according to a variation of the embodiment of FIG. 4.

Another possible configuration is shown in FIG. 6, which is identical to FIG. 4, except as follows: Instead of a single notch 24, there are two notches punched across the top edge of the plate. The right-hand notch 29 is circular, of radius R, and has a fixed depth—preferably about equal to R. The left-hand notch 28 has a width W, substantially greater than the diameter of pin 22, and a variable depth, as effected in the punch by a correspondingly shaped and positioned die (not shown); at least a portion of its end edge is straight. When being mounted on the imagesetter's cylinder, the plate is first positioned so that right-hand pin 23 fully engages notch 29 (which determines its lateral position), then is pushed until the (straight) end of notch 28 touches pin 22 (which completes its rotational orientation at the desired angle $\alpha$).

Figure 5:
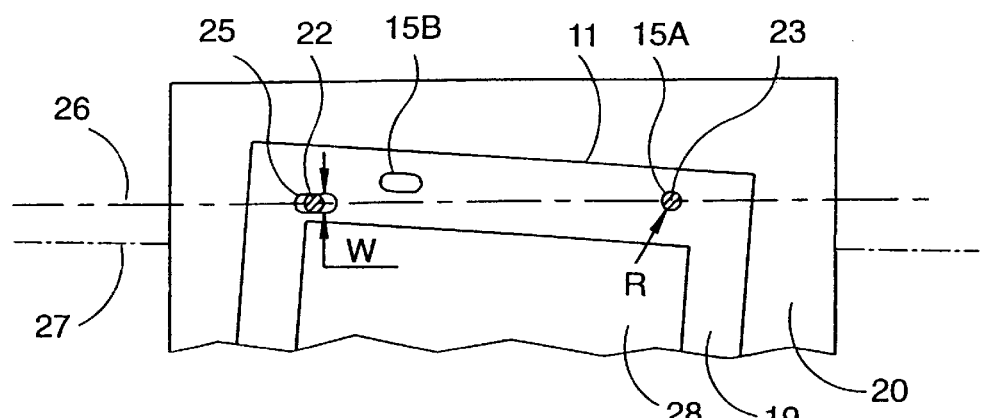
FIG. 5 schematically illustrates positioning a plate on the drum of an imagesetter according to a second embodiment of the present invention.

Yet another possible configuration is shown in FIG. 5, which is identical to FIG. 4, except as follows: Instead of the notch 24, there is punched an oval hole 25, whose center is at a lateral 5 distance D from the farthest punched print registration hole, which, in the present example, is assumed to be circular and is marked as 15A. Oval hole 25, whose long dimension is essentially parallel to the plate's edge 11, is made by a punch in a manner similar to that illustrated in FIG. 3, namely by an adjustable position die 14, except that the cutting shape of the die is that of a corresponding oval and except that the orthogonal position of the center of the resultant hole is measured with respect to line 10 (joining print registration holes 15B and 15A). Plate 19 is mounted on cylinder 20 so that pin 23 engages hole 15A and pin 22 engages hole 25. Note that print registration hole 15B is not used for this operation. The result is, as in the first configuration, that the edge 11 of the plate assumes an angle $\gamma$ with respect to line 26—which angle is preferably made equal to α+δ. In a variation of the later configuration (applicable, for example, in the case that no print registration holes are used) the right-hand, circular hole need not be one of the print registration holes (i.e. 15A), but may be independently punched for the purpose.

It is appreciated that the punch containing die 14 need not necessarily be also operative to punch print registration holes 15. The latter could, for example, be punched in a separate, conventional punch. Another example is the case that the press does not use registration pins.

Yet another case is that of pre-punched plates, that is—plates that already have the proper print registration holes. In this case the punch according to the present invention may have yet another configuration, namely: There are no dies for print registration holes and, instead of stop pins 16 and 17, there are, attached to the mount, registration pins, placed so as to engage the print registration holes of the plate; die 14 is placed at a proper position with respect to these pins. Clearly, in this case, the punching configuration and mounting procedure is preferably any of those described hereabove with reference to FIG. 5. It is appreciated that also other configurations or combinations of holes and/or notches and of registration procedures may be employed in a similar manner—all coming within the scope of the present invention.

Figure 7:
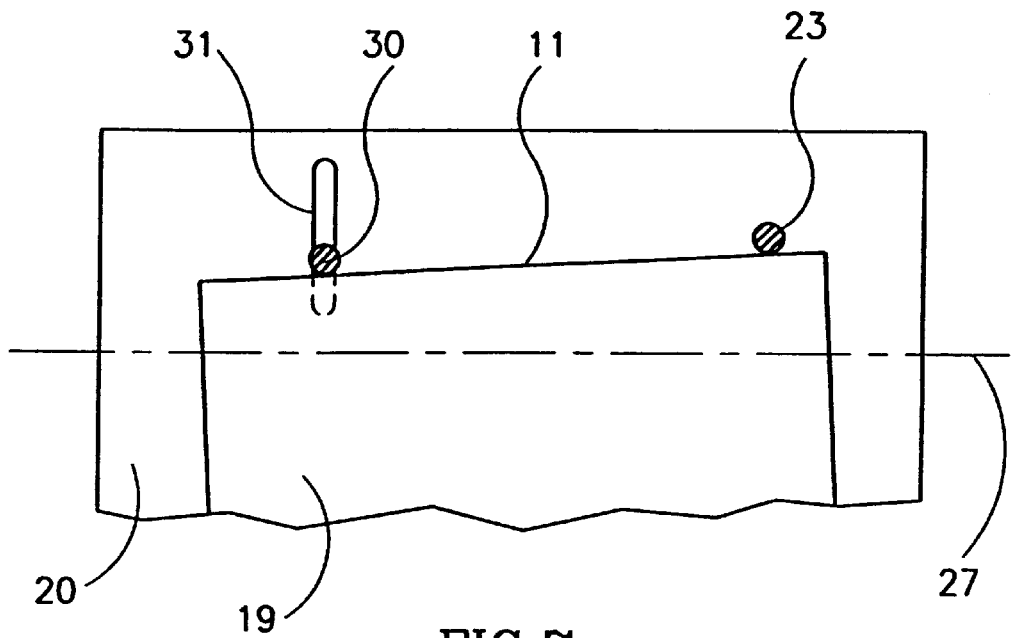
FIG. 7 schematically illustrates positioning a plate on the drum of an imagesetter according to a third embodiment of the present invention.
Figure 8:
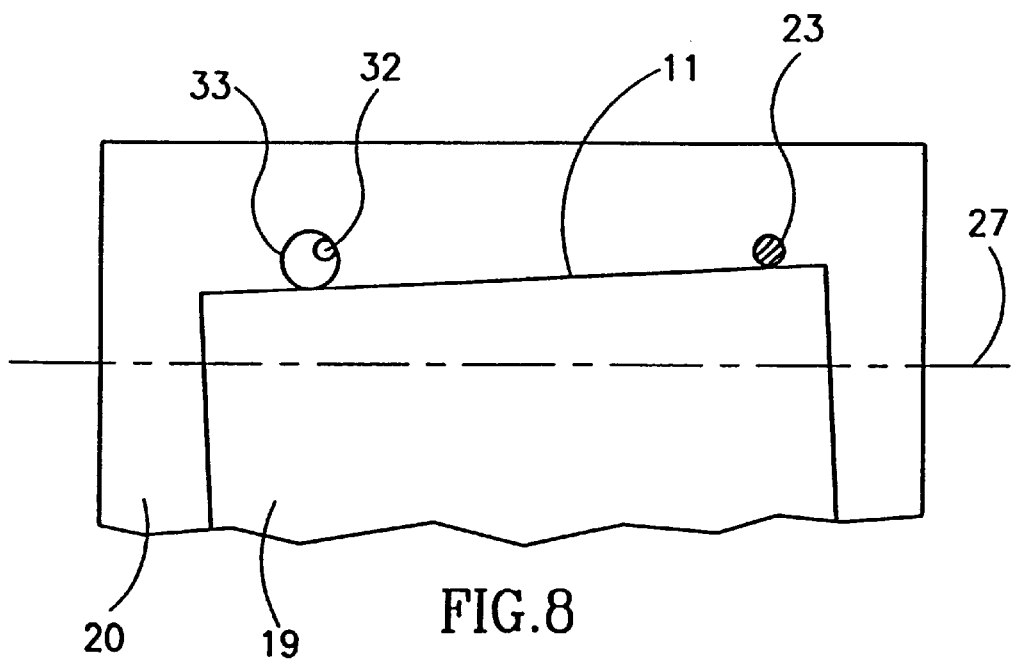
FIG. 8 schematically illustrates positioning a plate on the drum of an imagesetter according to a variation of the embodiment of FIG. 7.

A further configuration of the present invention is illustrated in FIG. 7, which shows the surface 20 of the drum of an imagesetter, to which are attached stop pins 23 and 30. Pin 23 is similar to that of FIG. 4. Pin 30, however, is mounted in a track 31 that runs a short distance circumferentially and is lockable at any position along the track. In operation, pin 30 is locked in a position such that a line through the centers of both pins forms an angle α with a line parallel to the drum's axis 27. Plate 19 is then mounted on the drum so that its top edge 11 is flush against both pins 23 and 30. It is noted that in this configuration, the top edge is the reference line and that therefore any print registration holes should be punched in relation to this edge. A variation of this configuration is shown in FIG. 8. Here, the combination of pin 30 and track 31 is replaced by a round cam 33 that is eccentrically rotatable about axis 32 and lockable in any such orientation. Clearly, by locking cam 33 in an appropriate orientation and pushing edge 11 of plate 19 against cam 33 and pin 23, edge 11 can be made to form the desired angle α, as before.

Still another configuration of the present invention, applicable only to plates that are not prepunched, is the following: A punch capable of punching conventional print registration holes is equipped with a pair of stop pins. One of the stop pins, similar to one of pins 16 of FIG. 3, is fixedly attached to the mount of the punch. The other stop pin is movable and lockable along a short track, in a manner similar to pin 30 and track 31 of FIG. 7. In operation, the movable pin is locked in a certain position, a plate is placed in the punch with its top edge flush against the two pins and the punch is operated to effect print registration holes. The position of the movable pin is chosen so that the edge of the plate assumes an angle −γ with respect to a normal orientation (which usually is parallel to a line joining the centers of the registration holes). As a result, the line joining the centers of the registration holes is rotated by an angle γ from its normal orientation. Preferably γ is made to equal α. The plate is also exposed in an imagesetter, where it is placed on the drum in a normal orientation, with it top edge flush against two stop pins, similar to pins 22 and 23 of FIG. 4, so as to be essentially parallel to the drum's axis. Clearly, in this case, the edges of the image formed on the drum will be rotated by angle α from being parallel to the edges of the plate. When, however, the plate is subsequently mounted on the printing cylinder of a press, registered to pins thereon, its edges will be rotated by −γ, and therefore presumably by −α, from the normal and consequently the image will assume an essentially normal orientation. This configuration is practical if the objection on ground (d), listed in the background section hereabove, is not valid. According to a variation of the present configuration, the stop pin and track in the punch is replaced by an eccentric cam arrangement, similar to cam 33 of FIG. 8.

It will be appreciated that, while the description hereabove is with regard to a printing plate, the present invention is equally applicable to other situations requiring positioning of a plate at an accurate orientation and particularly—to mounting a lithographic film on the drum of an imagesetter. In this latter case, the film will be subsequently registered to a plate, for contact copying, using either its edge (such as edge 11) or punched holes (similar to print registration holes 15) for reference.

It will be further appreciated that, while the invention has been described with respect to a limited number of embodiments, many variations, modifications and other applications of the invention may be made.

What I claim is:

1. A method for recording a rectangular image along helical tracks on a rectangular plate, while the plate is attached to the cylindrical surface of a rotating drum in an imagesetter, one edge of the plate being a reference edge, so that an edge of the image essentially parallels the reference edge, the method comprising
   (a) providing on the surface of the drum first and second fixed protruding members;
   (b) determining a correction angle;
   (c) providing on the plate first and second contact edges, their positions relative to the reference edge being determined according to said correction angle and at least the first contact edge not forming part of the reference edge;
   (d) attaching the plate to the surface of the drum so that said first contact edge is in contact with said first protruding member and said second contact edge is in contact with said second protruding member, no edge of the plate then being parallel to the axis of the drum.

2. The method of claim 1, whereby step (c) includes cutting a first notch into the plate across the reference edge, said first contact edge forming at least part of the edge of said first notch.

3. The method of claim 2, whereby said second contact edge forms part of the reference edge.

4. The method of claim 3, whereby any line tangent to both of said protruding members is not parallel to the axis of the drum.

5. The method of claim 2, whereby step (c) further includes cutting a second notch into the plate across the reference edge, said second contact edge forming part of the edge of said second notch.

6. The method of claim 1, whereby said first protruding memebr is cylindrical and step (c) includes punching a first hole into the plate, said first contact edge forming at least part of the edge of said first hole.

7. The method of claim 6, whereby said second protruding memebr is cylindrical and step (c) further includes punching a second hole into the plate, said second contact edge forming at least part of the edge of said second hole.

8. The method of claim 7, whereby said first hole is elongated, its narrow dimension matching the diameter of said first protruding member, and said second hole is round, its diameter matching the diameter of said second protruding member.

* * * * *